(12) United States Patent
Uesugi

(10) Patent No.: US 6,795,694 B2
(45) Date of Patent: Sep. 21, 2004

(54) AUTOMATIC GAIN CONTROL SYSTEM

(75) Inventor: Hiroyuki Uesugi, Saitama (JP)

(73) Assignee: NEC Corporation, Tokyo (JP)

( * ) Notice: Subject to any disclaimer, the term of this patent is extended or adjusted under 35 U.S.C. 154(b) by 635 days.

(21) Appl. No.: 09/816,353

(22) Filed: Mar. 26, 2001

(65) Prior Publication Data
US 2001/0027090 A1 Oct. 4, 2001

(30) Foreign Application Priority Data
Mar. 24, 2000 (JP) ......................................... 2000-088521

(51) Int. Cl.⁷ .............................. H04B 1/04; H03G 3/10
(52) U.S. Cl. ..................... 455/126; 455/127.2; 330/278; 330/281
(58) Field of Search ............................. 455/126, 127.2, 455/115.1, 69, 522, 232.1, 250.1; 330/281, 278, 284, 293

(56) References Cited

U.S. PATENT DOCUMENTS

| 5,144,258 | A | * | 9/1992 | Nakanishi et al. ........... 330/129 |
| 5,376,895 | A | * | 12/1994 | Aihara ......................... 330/129 |
| 5,625,647 | A | * | 4/1997 | Kawasaki ..................... 375/295 |
| 5,712,593 | A | * | 1/1998 | Buer et al. .................... 330/129 |
| 5,852,770 | A | * | 12/1998 | Kasamatsu ................... 455/126 |
| 5,963,090 | A | | 10/1999 | Fukuchi |
| 6,064,501 | A | * | 5/2000 | Roberts et al. ................ 398/11 |
| 6,088,583 | A | * | 7/2000 | Shimizu et al. ........... 455/235.1 |

FOREIGN PATENT DOCUMENTS

| EP | 0 731 556 A1 | 9/1996 | |
| JP | 358075308 A | * 5/1983 | ............ H03G/3/00 |
| JP | 7-336243 A | 12/1995 | |
| WO | WO 00/16473 A1 | 3/2000 | |

* cited by examiner

Primary Examiner—Duc M. Nguyen
(74) Attorney, Agent, or Firm—Sughrue Mion, PLLC

(57) ABSTRACT

Discrete data of a base-band signal obtained by a control unit is multiplied by data equivalent to a time constant of a wave detector unit, thus enabling the deterioration in a detection voltage generated during detection of a modulation wave having a marked variation in amplitudes such as CDMA. It is possible to obtain a stable power outputted by an RF unit. Accordingly, the stable automatic gain control can be performed in consideration of the variation in the detection voltages due to the type of signals inputted to the wave detector unit, irrespective of the type of inputted signals.

13 Claims, 8 Drawing Sheets

AUTOMATIC GAIN CONTROL SYSTEM

BACKGROUND OF THE INVENTION

The present invention relates to an automatic gain control system and, more particularly, to an automatic gain control system used for a mobile communication unit adopting CDMA (Code Division Multiple Access) for multi-access using spread spectrum.

Hitherto, communication apparatuses, in particular, digital mobile communication terminal apparatuses use an automatic gain control system for controlling the gain of a transmission power by comparing a base-band signal as reference data to be generated by a transmit-receive control unit with detection data of a transmission output to obtain a stable transmission power.

Generally, a wave detector unit used when forming the detection data of the transmission power comprises a diode, a capacitor C, and a resistor R, etc. The wave detector unit detects an envelope for an input signal.

However, when an envelope of a modulated wave having a varying amplitude is detected for a non-modulated wave having a predetermined power, the power of the input signal might not be effectively converted into a voltage component if a suitable level of variation in charging/discharging determined by a time constant CR is not supplied. Therefore, for correct detection, it is necessary to set a proper time constant determined by the capacitor C and the resistor R.

However, in a system wherein a plurality of users use the same frequency, typically, e.g., in CDMA for mobile communication, power is amplified by controlling the power of a used signal on the basis of a user's position. It is difficult to obtain the proper time constant CR corresponding to all output patterns of the modulated waves because the variation in level of the power is remarkable by multiplexing a plurality of signals to improve the availability of frequencies, thereby preventing stable detection.

SUMMARY OF THE INVENTION

The present invention is made in consideration of overcoming the above problems. It is an object to provide an automatic gain control system capable of compensating for a difference which is caused by a time constant during detection. According to the present invention, stable gain control is performed without being influenced by the remarkable variation in envelopes of a used signal.

More specifically, according to a first aspect of the present invention, in an automatic gain control system, a base-band signal as reference data of a transmission wave is multiplied by a time constant during detection, thereby compensating for the amount of deterioration in the transmission wave which is caused by the time constant during detection.

According to a second aspect of the present invention, an automatic gain control system includes a transmit-receive control unit for generating a base-band signal serving as reference data of a transmission wave, a radio frequency converter unit for converting a frequency of the base-band signal based on a gain variation control signal, a coupler unit for splitting the base-band signal whose frequency is converted, a wave detector unit for detecting one part of the split base-band signal, and a gain variation calculation circuit for outputting to the radio frequency converter unit the gain variation control signal which is generated based on a detection result by the wave detector unit and discrete data of the base-band signal outputted by the transmit-receive control unit. The wave detector unit outputs envelope data of the split part of the base-band signal and detected capacity information having a time constant of the wave detector unit to the gain variation calculation circuit as the detection result. Further, the gain variation calculation circuit has an A/D converter for converting the envelope data into discrete data, and a comparing calculation circuit for generating the gain variation control signal based on the result of comparing a value obtained by multiplying the discrete data of the base-band signal from the transmit-receive control unit by the time constant, as the detected capacity information, with the discrete data of the envelope data converted by the A/D converter.

According to a third aspect of the present invention, in the automatic gain control system, further, the transmit-receive control unit includes a serial-to-parallel converter for serial-to-parallel conversion of an input signal, an I/Q encoder for encoding the serial-to-parallel-converted signal by the serial-to-parallel converter to an I-channel signal and a Q-channel signal, a code for designating code information of the I-channel signal and the Qch signal encoded by the I/Q encoder, a modulator for modulating the I-channel signal and the Qch signal encoded by the I/Q encoder on the basis of the code information designated by the code, a power controller for controlling transmission powers of the I-channel signal and the Qch signal which are modulated by the modulator, at least two multipliers for controlling amplitude values of the I-channel signal and the Qch signal on the basis of the control of the transmission power by the power controller, a multiplexer for multiplexing the I-channel signal and the Qch signal from the multiplier, a filter for limiting bands of the Ich signal and the Q-channel signal from the multiplexer, a quadrature modulator for synthesizing and quadrature-modulating the Ich signal and the Q-channel signal whose bands are limited by the filter, a frequency converter for converting a frequency of the signal quadrature-modulated by the quadrature modulator into a desired frequency, and a D/A converter for converting the signal which is converted into the desired frequency by the frequency converter into an analog signal. The transmit-receive control unit outputs the signal quadrature-modulated by the quadrature modulator to the comparing calculation circuit as the discrete data of the base-band signal, and also outputs the analog signal converted by the D/A converter to the radio frequency converter unit as the base-band signal.

According to a fourth aspect of the present invention, in the automatic gain control system, the radio frequency converter includes a first mixer for upconverting the base-band signal from the transmit-receive control unit, a band-pass filter for removing an unnecessary wave other than a necessary frequency band from an output from the first mixer, a first amplifier for amplifying an output from the band-pass filter to a necessary power, a second mixer for upconverting the output amplified by the first amplifier, a variable attenuator for varying a gain of an output from the second mixer based on the gain variation control signal, and a second amplifier for amplifying an output from the variable attenuator to an output having a desired magnitude.

According to a fifth aspect of the present invention, in the automatic gain control system, the coupler unit directly outputs the base-band signal, without changing said signal, whose gain is controlled by the radio frequency converter unit based on the gain variation control signal as a transmission wave, and also supplies a signal by splitting 1/N of the transmission signal (N is an integer equal to 1 or more) to the wave detector unit.

According to a sixth aspect of the present invention, in the automatic gain control system, the comparing calculation circuit includes a time constant table in which the time constant, as the detected capacity information from the wave detector unit, is stored, a multiplier circuit for multiplying the discrete data of the base-band signal from the transmit-receive control unit by the time constant stored in the time constant table and for outputting discrete data, a comparator for comparing the discrete data from the multiplier circuit with the discrete data from the A/D converter, and a variable attenuator control unit for generating the gain variation control signal for controlling conversion by the variable attenuator based on a comparison result by the comparator.

According to a seventh aspect of the present invention, in the automatic gain control system, the comparator includes a first delay circuit for delaying the discrete data from the multiplier circuit by an arbitrary time, a second delay circuit for delaying the discrete data from the A/D converter by an arbitrary time, a first averaging circuit for averaging an output from the first delay circuit over a predetermined time, a second averaging circuit for averaging an output from the second delay circuit over the predetermined time, an adder for adding an output from the first averaging circuit and an output from the averaging circuit and outputting an average voltage value, a comparison value conversion table in which a comparison value for the average voltage value outputted from the adder is stored, and a multiplier for multiplying the average voltage value by the comparison value stored in the comparison value conversion table.

According to the present invention, by multiplying the base-band signal obtained by the transmit-receive control unit (control unit) by data equivalent to the time constant of the wave detector unit, the deterioration in the detection voltage is compensated. Incidentally, this deterioration in the detection voltage is caused in the case of detecting a modulation wave having a marked variation in amplitudes such as CDMA. Accordingly, it is possible to eliminate the variation in the detection voltage due to the type of signals inputted in the wave detector unit.

DESCRIPTION OF THE PREFERRED EMBODIMENTS

Next, an automatic gain control system in an embodiment of the present invention will be described in detail with reference to the drawings. The automatic gain control system according to the present embodiment will be shown in FIGS. 1 to 12.

Consider a system in which a plurality of users use the same frequency in the present invention. In the case of CDMA, the electrical power is adjusted by controlling the power of a used signal to make the electrical power from a base station constant depending on the user's position. Further, in CDMA, control operation is performed in such a manner that a plurality of signals are multiplexed to improve the availability of frequencies.

Figure 1:
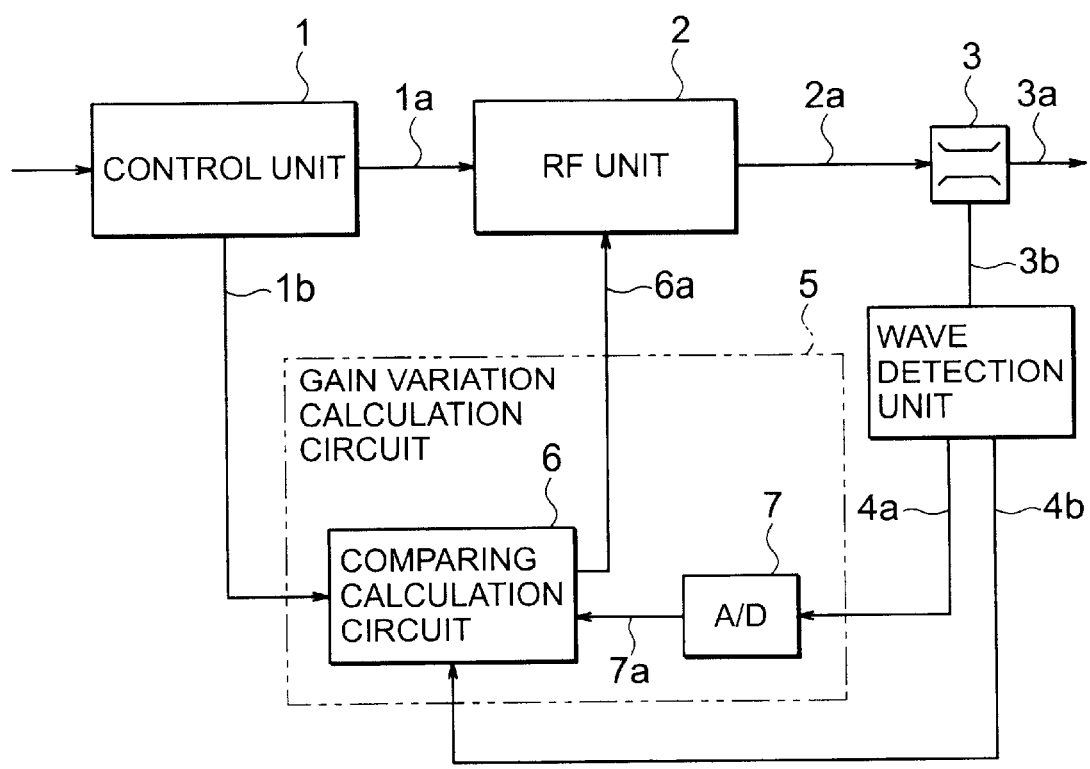
FIG. 1 is a block diagram of the structure of an automatic gain control system of the present invention.

FIG. 1 is a block diagram schematically showing the structure of the automatic gain control system of the present embodiment. Referring to FIG. 1, the automatic gain control system according to the present embodiment comprises a transmit-receive control unit (hereinlater, referred to as a control unit) 1, an RF unit (radio frequency converter unit) 2, a coupler 3, a wave detector unit 4, and a gain variation calculation circuit 5. The gain variation calculation circuit 5 comprises a comparing calculation circuit 6 and an A/D converter 7.

The control unit 1 modulates a digital signal to be transmitted, thereby generating a base-band signal 1a serving as reference data of a transmission wave. Then, the base-band signal 1a is outputted to the RF unit 2. Further, the control unit 1 outputs discrete data 1b serving as a synthesization amplitude of the base-band signal 1a to the gain variation calculation circuit 5.

The RF unit 2 outputs a transmission wave 2a to the coupler 3. The transmission wave 2a is obtained by converting the base-band signal 1a, as a reference signal of the transmission wave generated by the control unit 1, into a frequency necessary for transmission.

The coupler 3 directly outputs the transmission wave 2a outputted by the RF unit 2 without processing as a transmission wave 3a. The coupler 3 also outputs coupling signal 3b obtained by splitting 1/N of the transmission wave 2a to the wave detector unit 4.

The wave detector unit 4 detects an envelope of the coupling signal 3b. Thereafter, the wave detector unit 4 supplies envelope data 4a and detected capacity information 4b to the gain variation calculation circuit 5.

The gain variation calculation circuit 5 generates the gain variation control signal (offset signal) 6a for compensating a frequency conversion process (modulation process) of the RF unit 2 for the discrete data 1b supplied by the control unit 1, based on the envelope data 4a and detected capacity information 4b which are supplied by the wave detection unit 4. Further, the gain variation calculation circuit 5 outputs the offset signal 6a to the RF unit 2.

Figure 2:
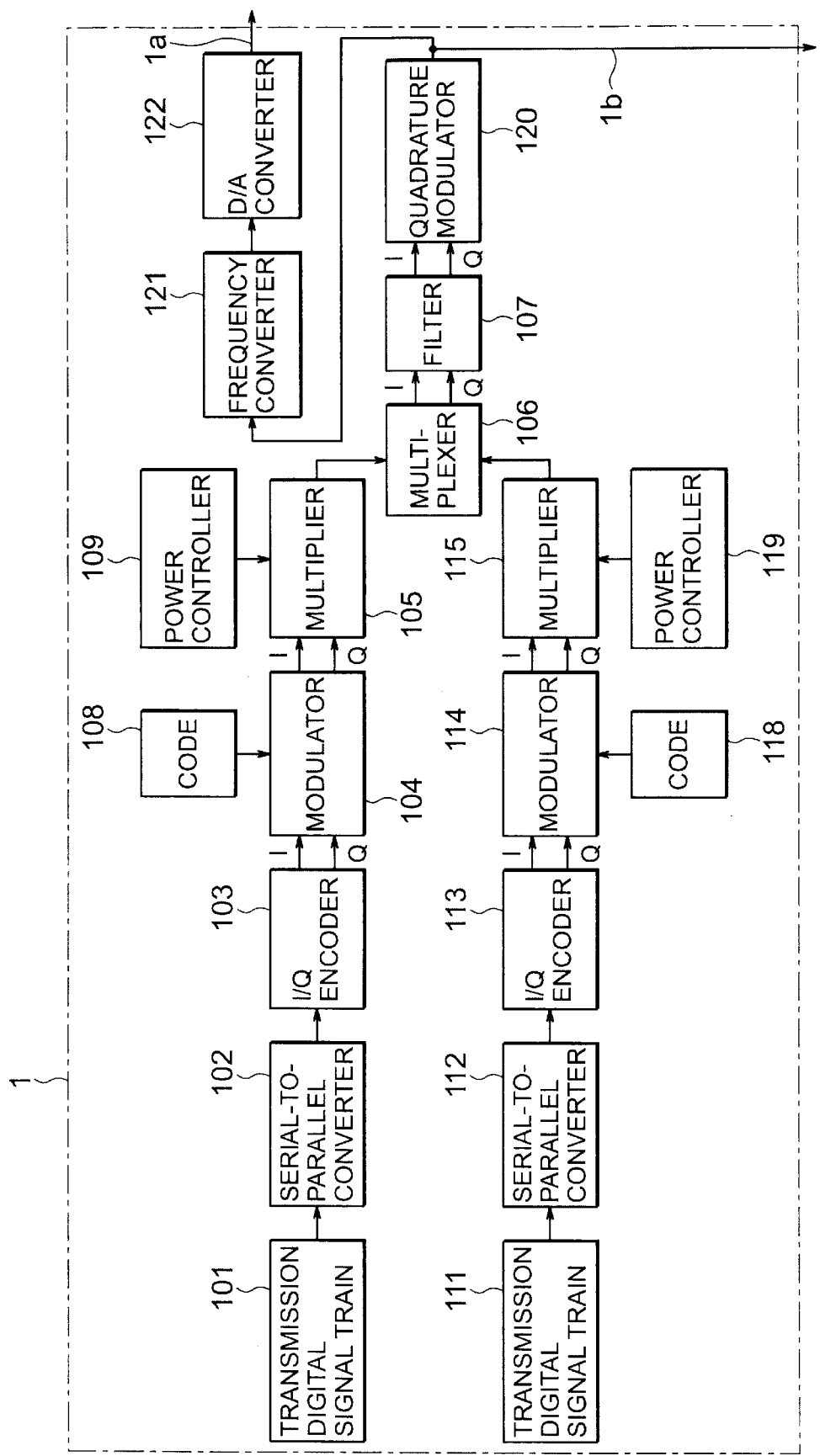
FIG. 2 is a block diagram showing the structure of a control unit in the automatic gain control system in FIG. 1.

FIG. 2 is a block diagram schematically showing the structure of the control unit 1 in the automatic gain control system of the present embodiment. Referring to FIG. 2, the control unit 1 of the present embodiment comprises transmission digital signal trains 101 and 111, serial-to-parallel converters 102 and 112, an I/Q encoders 103 and 113, modulators 104 and 114, multipliers 105 and 115, a multiplexer 106, a filter (route Nyquist filter) 107, codes 108 and 118, power controllers 109 and 119, a quadrature modulator 120, a frequency converter 121, and a D/A converter 122.

A description is given of a base-band signal generation process by the control unit 1 shown in FIG. 2 in the case of generating a double-multiplexed CDMA base-band signal hereinbelow.

First of all, the transmission digital signal trains 101 and 111 are inputted to the serial-to-parallel converters 102 and 112, and the inputs signals are inputted to the I/Q encoders 103 and 113, which are post processing components of the serial-to-parallel converters 102 and 112, every 2 bits. Because 2 bits can be transferred at each signal point when the signal is modulated based on a QPSK (Quadri-phase Shift Keying) modulation system.

The I/Q encoders 103 and 113 generate transmission signal points at which 2 bits become one code point on an I/Q-plane based on the QPSK modulation system.

In the case of the CDMA signal, the modulators 104 and 114 modulate the transmission signal points generated by the I/Q encoders 103 and 113. In the multipliers 105 and 115, the power controllers 109 and 119 control amplitude values of the encoded transmission signal points under transmission conditions. After that, the multiplexer 106 multiplexes the transmission signal points whose amplitude are controlled.

The modulators 104 and 114 can perform various modulation processes for the signal to be inputted. For example, the route Nyquist filter 107 limits a frequency band of a transmission signal multiplexed by the multiplexer 106. The multiplexed transmission signal whose frequency band is limited is subjected to processes such as the synthesization and frequency conversion of the I- and Q-channels by the quadrature modulator 120.

Generally, the route Nyquist filter 107 divides a square root of a total transfer function to a transmission side and a reception side to obtain the product of a filter transfer function in transmission/reception having a Nyquist filter characteristics.

The frequency converter 121 converts a frequency of the transmission signal which is subjected to the synthesization and frequency conversion of the I- and Q-channels by the quadrature modulator 120. Thereafter, the D/A converter 122 converts the frequency-converted signal as a digital signal into an analog signal, and supplies the analog signal to the RF unit 2 serving as the post-processing component as a base-band signal 1a to become a reference signal of the transmission signal.

The transmission signal subjected to the synthesization and frequency conversion of the I- and Q-channels by the quadrature modulator 120 is supplied to the comparing calculation circuit 6 in the gain variation calculation circuit 5 as the discrete data 1b.

Although a modulation process is performed in the modulators 104 and 114 based on the codes 108 and 118, the modulation system is limited to the QPSK modulation system and processes based on various modulation systems can be performed in the modulators 104 and 114.

As mentioned above, the base-band signal 1a formed by the control unit 1 is supplied to the RF unit 2.

Figure 3:
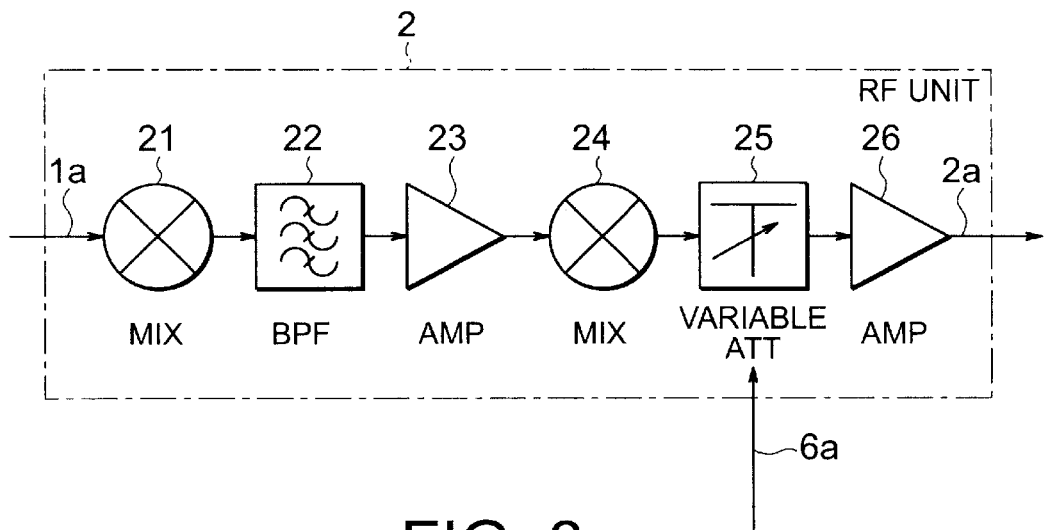
FIG. 3 is a block diagram showing the structure of an RF unit in the automatic gain control system in FIG. 1.

FIG. 3 is a block diagram schematically showing the structure of the RF unit 2 in the automatic gain control system of the present embodiment. As shown in FIG. 3, the RF unit 2 comprises a mixer (MIX) 21, a band-pass filter (BPF) 22, an amplifier (AMP) 23, a mixer (MIX) 24, a variable attenuator (variable ATT) 25, and an amplifier (AMP) 26.

The MIX 21 upconverts the base-band signal 1a supplied by the control unit 1, the BPF 22 removes unnecessary waves other than the necessary frequency band, and the AMP 23 amplifies the signal to a power necessary for transmission.

After the MIX 24 upconverts the signal amplified by the AMP 23 again, the variable ATT 25 varies the total gain of the RF unit 2 by using the offset signal (gain variation control signal) 6b supplied from the gain variation calculation circuit 5, which will be described hereinbelow. The AMP 26 amplifies an output signal from the variable ATT 25 to an amplitude having a desired magnitude. The amplified transmission wave 2a is supplied to the coupler 3, which is a post-processing component.

Actually, it is extremely difficult to hold the power of the thus-obtained transmission wave 2a constant because of the characteristics of the devices and variation in temperature. Therefore, a temperature compensation circuit and an automatic gain control circuit are used to keep the output power constant. This automatic gain control circuit controls the transmission output gain by feed-back (negative feed-back) of the envelope data 4a as transmission-power-value information of the transmission wave 2a supplied from the RF unit 2 and by control the variable ATT 25 in the RF unit 2.

Figure 4:
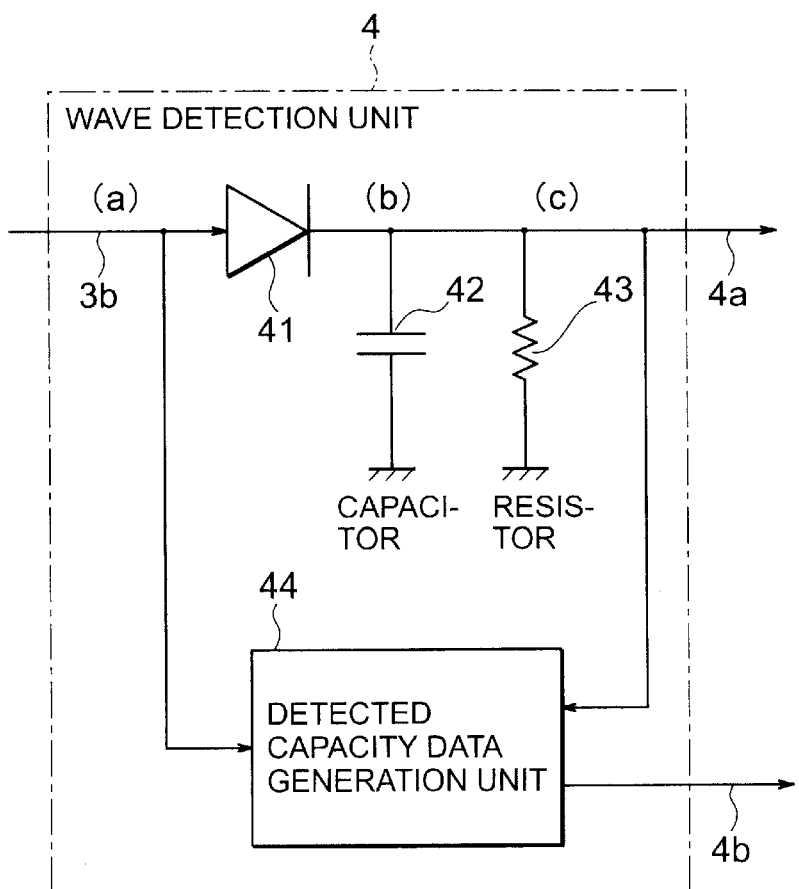
FIG. 4 is a block diagram showing the structure of a wave detector unit in the automatic gain control system in FIG. 1.
Figure 5A:
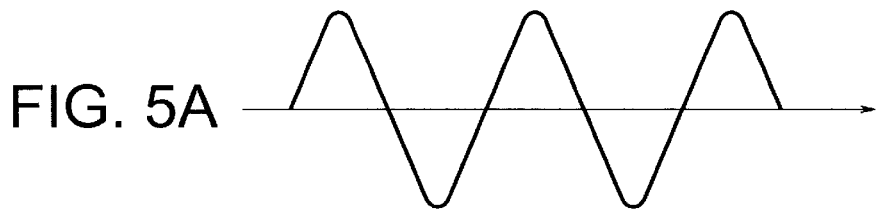
FIGS. 5A to 5C are graphs, each corresponding to (a), (b), and (c) shown in FIG. 4, respectively, showing voltage values (output voltage waveforms) which are detected by the wave detector unit shown in FIG. 4.
Figure 5B:
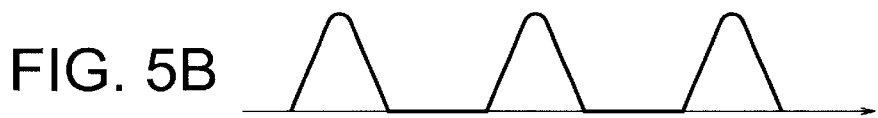
Figure 5C:
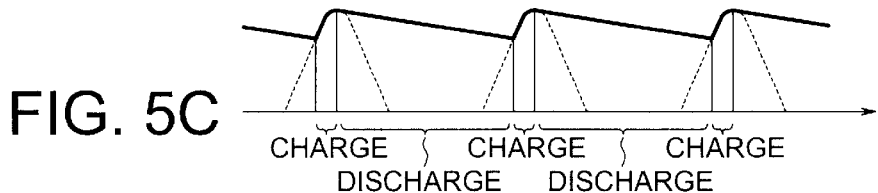

FIG. 4 is a circuit diagram showing the structure of the wave detector unit 4 in the automatic gain control system of the present embodiment. FIGS. 5A to 5C are graphs showing output voltage waveforms which are detected by the wave detector unit 4. As shown in FIG. 4, the wave detector unit 4 comprises a diode 41, a capacitor C 42, a resistor R 43, and a detected capacity data generator unit 44. The wave detector unit 4 outputs the envelope data 4a to the A/D converter 7 in the gain variation calculation unit 5 and also outputs the detected capacity information 4b to the comparing calculation circuit 6 in the gain variation calculation unit 5.

The diode 41 inputs the coupling signal 3b supplied by the coupler 3, and half-wave rectifies a wave of the coupling signal 3b. Thereafter, the coupling signal 3b which is half-rectified charges/discharges the capacitor C 42 and the resistor R 43. The envelope data 4a is supplied to the A/D converter 7 in the gain variation calculation circuit 5 and the detected capacity data generator unit 44, which are post-processing components.

The detected capacity data generator unit 44 outputs the detected capacity information 4b on the basis of the above-mentioned envelope data 4a and coupling signal 3b.

However, if the combination of the capacitor C 42 and resistor R 43 is not properly selected, the conversion voltage becomes too high/too low. In this case, efficient detection cannot be performed, thereby making it difficult to detect accurate information. In particular, in a system such as CDMA in which a plurality of users use the same frequency, the electrical power is increased by controlling the power as described above and a plurality of signals are also multiplexed for the sake of improving the availability of frequencies. Accordingly, this system handles the modulated wave having a marked variation in amplitude.

In this case, it is difficult to obtain a proper time constant for each signal and the detected voltage values vary. Herein, when the modulation wave has a large variation in waveform for a short time, a smoothing function of the wave detector unit 4 results in clipping of the detected voltage. In the clipped state, the power falls and a small detected voltage is outputted, thus varying the detected voltage.

Figure 6A:
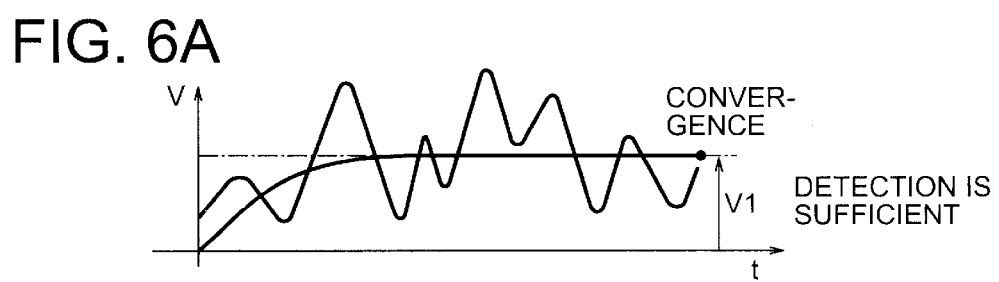
FIGS. 6A to 6C are diagrams showing the deterioration principle of an average voltage which is caused by a time constant in the wave detector unit shown in FIG. 4.
Figure 6B:
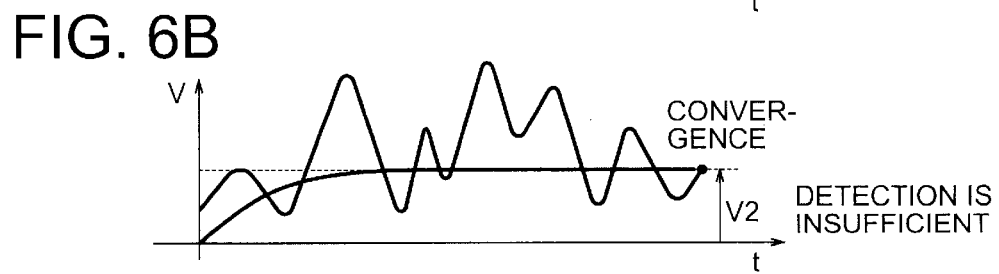
Figure 6C:
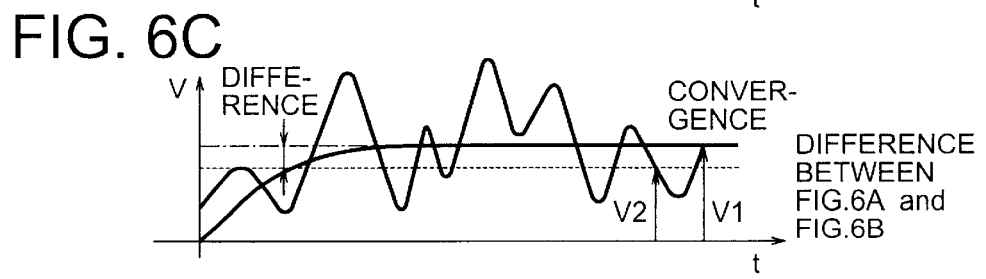

FIGS. 6A to 6C are diagrams showing the principle of deterioration of the average voltage due to a time constant of the wave detector unit of the present embodiment. As shown in FIG. 6A, V1 denotes an accurate detected voltage as a correct voltage, and V2 denotes a detected voltage of a modulated wave of an average voltage equal to V1.

On the contrary, as shown in FIG. 6B, sufficient detection is not performed when a proper time constant is not obtained. In this case, as shown in FIG. 6C, the detected voltage V2 becomes lower than V1. As mentioned above, if the detected voltages are varied, an error is caused in feed-back information and the automatic gain control becomes unstable.

In CDMA system, it is difficult to obtain the proper time constant corresponding to all output patterns of the modulation wave. In the present invention, the gain variation calculation circuit 5 assumes that there is deterioration in the wave detector unit 4. More specifically, the comparator 8 compares the envelope data 4a obtained by multiplying the time constant data equivalent to the wave detector unit 4 with the reference data in which the base-band signal 1a generated by the control unit 1 is information. Thus, the variation caused by the detection is compensated for.

Figure 7:
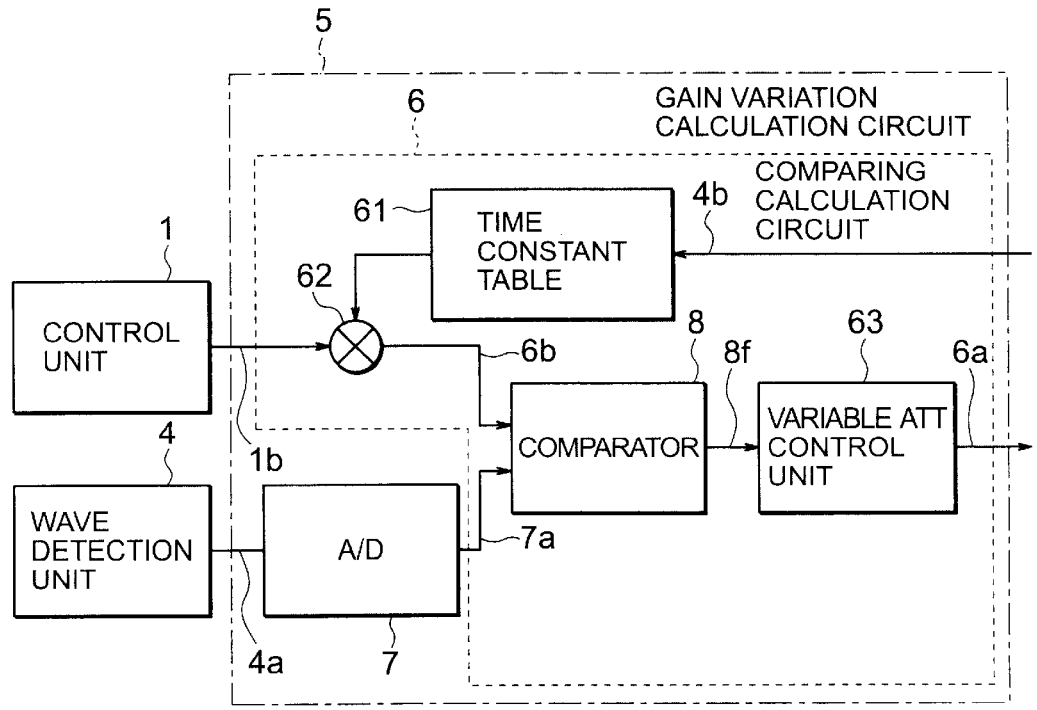
FIG. 7 is a block diagram showing the structure of a gain variation calculation circuit in the automatic gain control system in FIG. 1.

FIG. 7 is a block diagram schematically showing the structure of the gain variation calculation circuit 5 in the automatic gain control system of the present embodiment. As shown in FIG. 7, the gain variation calculation circuit 5 has the comparing calculation circuit 6 and the A/D converter 7 as mentioned above. The comparing calculation circuit 6 comprises the comparator 8, a time constant table 61, a multiplier 62, and a variable ATT control unit 63.

The time constant table 61 is a table for storing the detected capacity information 4b (time constant CR in the wave detector unit 4) which is generated by the detected capacity data generator unit 44 in the wave detector unit 4.

Envelope data 6b and discrete data 7a are inputted to the comparator 8. The envelope data 6b is obtained by multiplying the discrete data 1b inputted by the control unit 1 by a time constant CR, as the detected capacity information 4b, in the multiplier 62. The detected capacity information 4b is generated by the detected capacity data generator unit 44 whose data is stored in the time constant table 61. The A/D converter 7 converts the envelope data 4a outputted by the wave detector unit 4 into the discrete data 7a. This comparison result is outputted by the variable ATT control unit 63 of the post-processing component as processable data (offset data) 8f as will be described later on.

The time constant multiplied by the multiplier 62 needs to be set in advance based on characteristics of the wave detector unit 4. The time constant is stored in the time constant table 61 as the detected capacity information 4b (for example, expressed in the form of a function expression). Two types of forming methods for the detected capacity information 4b are indicated as examples below.

According to a first forming method, input/output characteristics of the wave detector unit 4 are measured in advance and, thereby, a detected capacity of the wave detector unit 4 is formulated and the obtained expression is stored in the detected capacity data generator unit 44.

According to a second forming method, when the detected capacity of the wave detector unit 4 is known, an expression of the detected capacity is directly stored in the time constant table 61.

Figure 8:
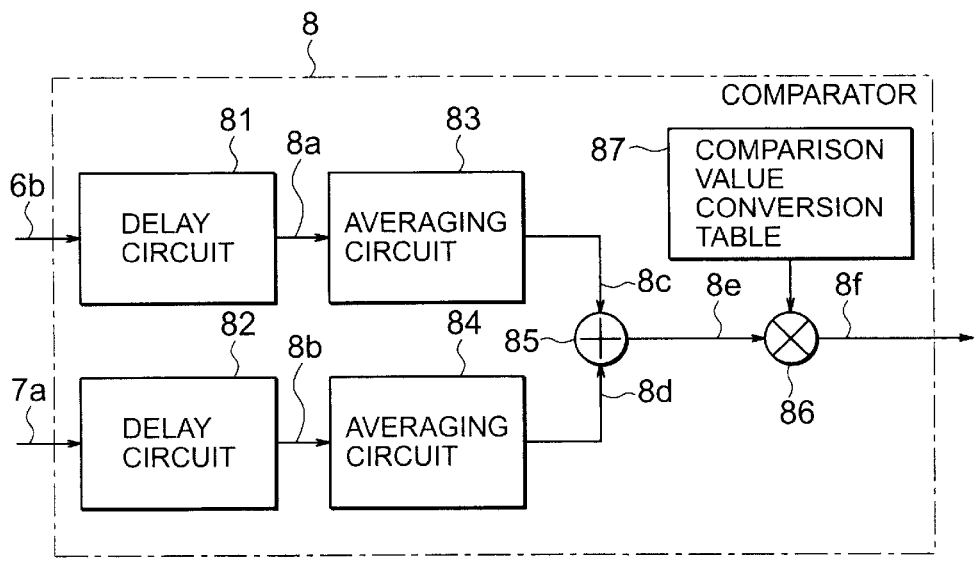
FIG. 8 is block diagram showing the structure of a comparator in the gain variation calculation circuit shown in FIG. 7.

FIG. 8 is block diagram showing the structure of the comparator 8 in the gain variation calculation circuit 5 of the present embodiment. Referring to FIG. 8, the comparator 8 comprises a first delay circuit 81, a second delay circuit 82, a first averaging circuit 83, a second averaging circuit 84, an adder 85, a multiplier 86, and a comparison value conversion table 87.

The envelope data 6b, which is obtained by multiplying the discrete data 1b by the time constant in the multiplier 62, is inputted to the first delay circuit 81. The discrete data 7a is inputted to the second delay circuit 82. Incidentally, the discrete data 7a is obtained by converting the envelope data 4a outputted by the wave detector unit 4 by the A/D converter 7. The first delay circuit 81 and the second delay circuit 82 assume that there is a delay differences due for the envelope data 6b and the discrete data 7a to propagation and calculation. More specifically, the first delay circuit 81 and the second delay circuit 82 form data 8a and 8b which are obtained by combining both comparison timings thereof.

The first averaging circuit 83 and the second averaging circuit 84 average the inputted data 8a and 8b at an arbitrary interval, thereby obtaining average voltage values 8c and 8d.

The adder 85 performs a differential process of a difference between the average voltage values 8c and 8d which are obtained by the average voltage values 83 and 84, thereby obtaining voltage difference data 8e.

The multiplier 86 multiplies the voltage difference data 8e outputted from the adder 85 by the comparison value stored in the comparison value conversion table 87, thereby obtaining the processable data 8f in the variable ATT control unit 63, which is a post-processing component.

Figure 9:
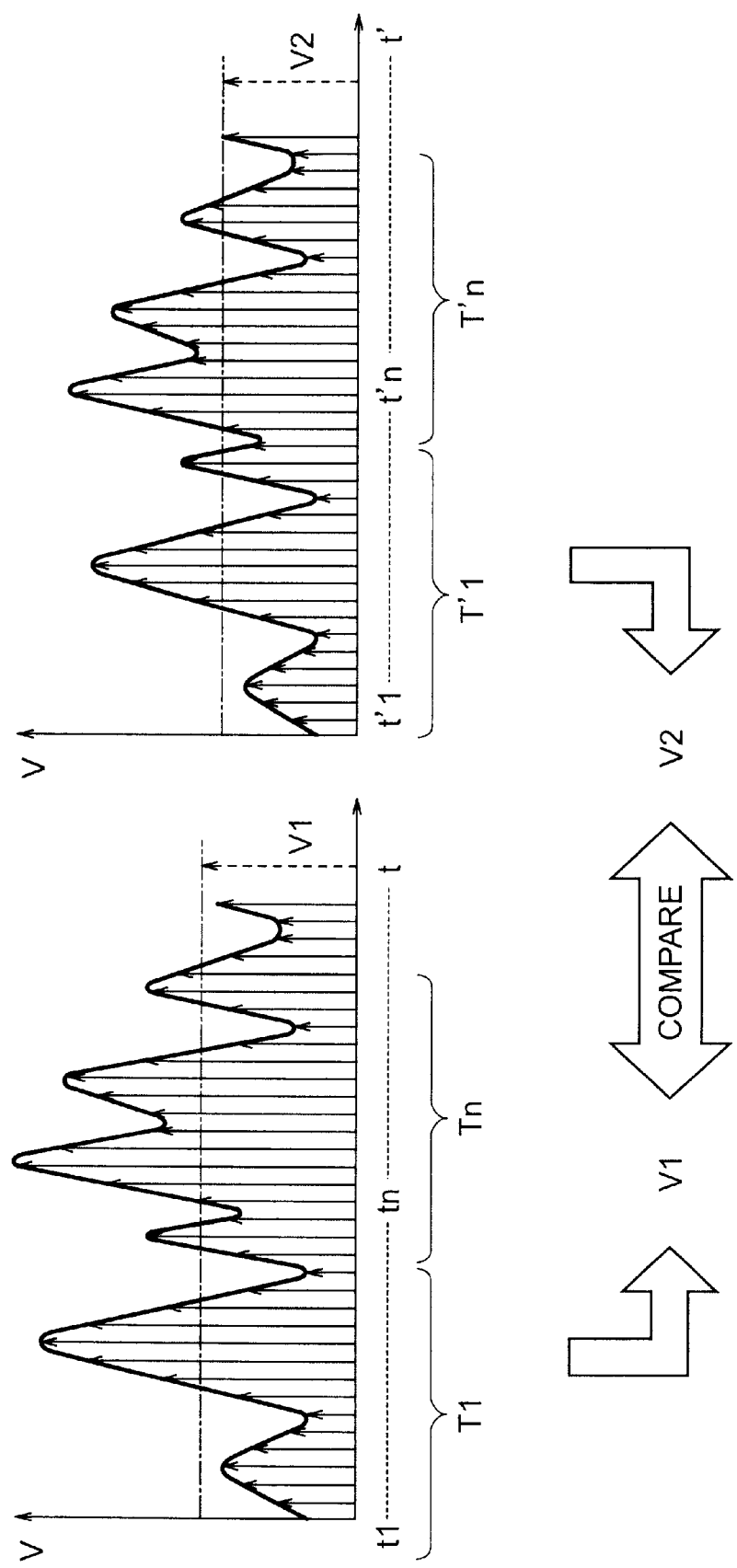
FIG. 9 is a diagram showing a comparing method of the comparator shown in FIG. 8.

FIG. 9 is a diagram showing a specific processing example of the first averaging circuit 83 and the second averaging circuit 84 of the present embodiment. As shown in FIGS. 7 and 8, the discrete data 1 from the control unit 1 and the discrete data 7a of the envelope data 4a from the wave detector unit 4 are inputted to the first averaging circuit 83 and the second averaging circuit 84, respectively.

As shown in FIG. 9, for the discrete data inputted at an arbitrary time t, an average voltage value V is calculated for an arbitrary interval T. The voltage difference data 8e is obtained by the differential process for obtained average voltage values V1 and V2. If the format of the average voltage data 8c and 8d is based on logarithm conversion, the average voltage data 8c and 8d must be compared under a condition using a logarithm format. On the other hand, if the format of the data is based on linear conversion, the average voltage data 8c and 8d must be compared under a condition using a linear format.

As shown in FIG. 8, the comparator 8 has the comparison value conversion table 87, and the obtained voltage difference data 8e is converted into an offset value. The processable data 8f, as offset data, is supplied to the variable ATT control unit 63 for controlling the amount of attenuation of the variable ATT 25 in the RF unit 2. The variable ATT control unit 63 converts the obtained offset data 8f into a voltage value, and supplies the voltage value to the variable ATT 25 as a control voltage, thereby varying the amount of attenuation.

Figure 10:
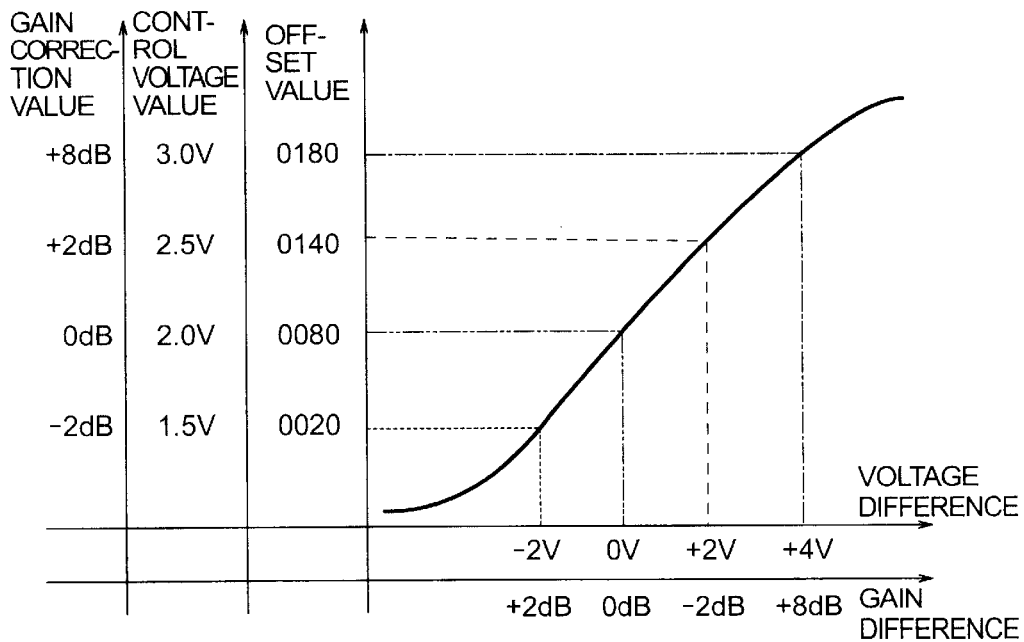
FIG. 10 is a diagram showing a comparing method of a comparison value conversion table in the comparator shown in FIG. 8.

As shown in FIG. 10, if the obtained voltage difference data 8e is +2V (lower than a transmission output level by 2 dB), the voltage difference data 8e is converted into the offset data 8f having an offset value 0140. When the offset data 8f is supplied to the variable ATT control unit 62, the control voltage to the variable ATT 25 in the RF unit 2 is set to +2.5V. Thereby, the amount of attenuation of the variable ATT 25 is reduced by 2 dB and the total gain of the RF unit 2 is corrected by +2 dB.

Figure 11A:
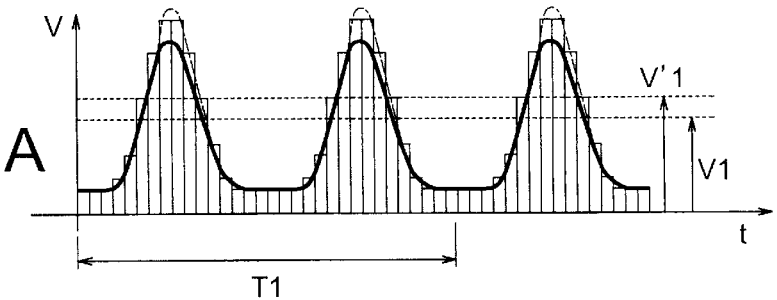
FIGS. 11A and 11B are diagrams showing the comparison principle of a time constant table in the gain variation calculation circuit shown in FIG. 7.

As shown in FIG. 11A, reference numeral V'1 denotes an average voltage of the base-band signal 1b generated by the control unit 1 over a certain time T1. When a signal having the same level is extracted by the coupler 3, the wave detector unit 4 detects this signal and the A/D converter 7 converts the detection signal into discrete data. Thereafter, an average voltage V'2 over a time T2 similar to T1 should be equivalent to V'1.

Figure 11B:
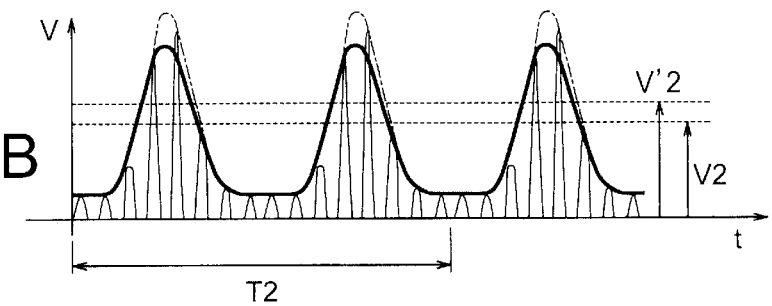

Actually, sufficient information in a portion having a large amplitude might not be fetched, as shown in FIG. 11B, depending on the value of the time constant determined by constants of the resistor R and capacitor C in the wave detector unit 4 in the case of using a signal having a large amplitude such as a signal based on the CDMA system. Therefore, the average voltage over the time T2 becomes V2 and might be lower than V'2.

In this case, in spite of the fact that a desired output level is obtained, it is recognized that the output level is low. This results in a problem that the voltage is controlled to a reduced level. Then, the amount of deterioration in the average voltage is considered. Incidentally, this deterioration is caused by the above-described detected capacity. In other words, data equivalent to the time constant is supplied as a time constant table. In this case, the time constant is assumed for the base-band signal 1b by the wave detector circuit 4. The base-band signal 1b is multiplied by this data, thereby forming the data V1 as reference data corresponding to the detected capacity of the wave detector unit 4.

Figure 12:
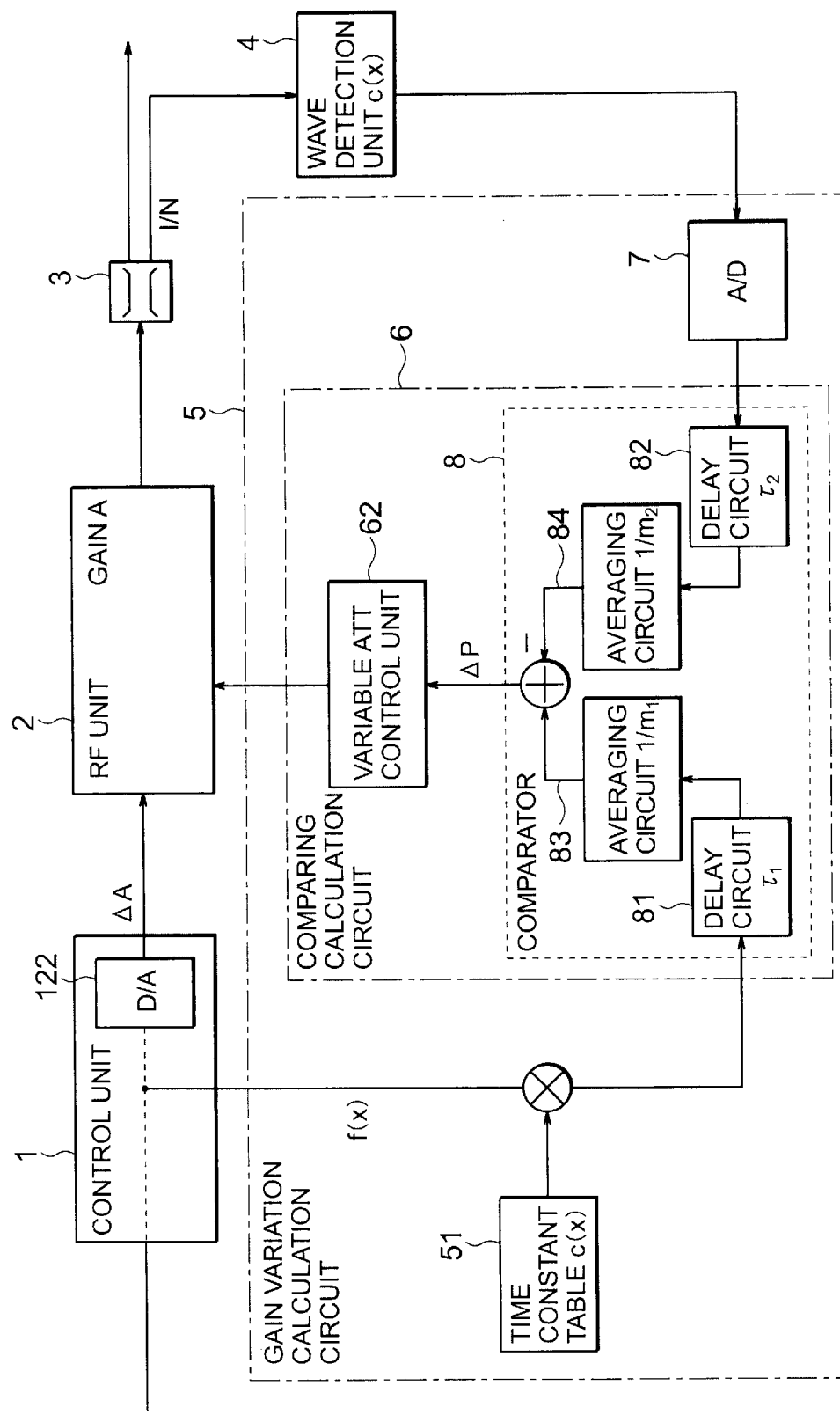
FIG. 12 is a block diagram showing an operation model of the automatic gain control system of the present invention.

FIG. 12 is a block diagram showing an operation model of the automatic gain control system in the present invention. Parameters shown in FIG. 12 are defined as follows.

f(x): waveform of the base-band signal generated by the control unit 1

ΔA: level variation value by the D/A converter 122

A: gain of the RF unit 2 c(x): detection response in the wave detector unit 4

1/N: amount of coupling by the coupler 3

$\tau_1$: delay characteristics of the first delay circuit 81

$\tau_2$: delay characteristics of the second delay circuit 82

$m_1$: correction coefficient of the amplitude of the first averaging circuit 83

$m_2$: correction coefficient of the amplitude of the second averaging circuit 84

ΔP: voltage-difference data by the differential process

Based on FIG. 12, when the operation is verified in terms of two points of the relationship in the amplitude domain and the relationship in the time domain, equations (1) and (2) are given below in relationship in the amplitude domain. The reference value is equal to the detection value. Equation (1) indicates the relationship in the amplitude domain. Equation (2) indicates the relationship in the time domain.

$$(1/m_1)c(x)=A(1+\Delta A)(1/N)(1/m_2)c(x) \quad (1)$$

However, either one of the correction coefficients $m_1$ and $m_2$ of the amplitudes may be equal to 1 in accordance with the variation in amplitude.

$$(\text{Calculation processing time})+\tau_1=(\text{delay in propagation ranging from the RF unit 2 to the wave detector unit 4})+\tau_2 \quad (2)$$

However, either one of $\tau_1$ and $\tau_2$ may be omitted in accordance with the processing time.

If the delay correction is performed by using equation (2), the Boolean expression ΔP of the output by the differential process is given by equation (3) below by using equation (1) above.

$$\Delta P=\{(1/m_1)f(x)\}c(x)-\{A(1+\Delta A)(1/N)(1/m_2)\}c(x) \quad (3)$$

Thus, the variable ATT control unit 62 in FIG. 5 performs the following operation. When ΔP>0, the variable ATT control unit 62 controls the variable ATT 25 in the RF unit 2, thereby increasing the gain. When ΔP<0, the variable ATT control unit 62 controls the variable ATT 25 in the RF unit 2, thereby decreasing the gain.

Conventionally, the reference value is a true value and the detection value is not a transmission power value when ΔP=0 because c(x) is not included in the reference value. Therefore, a stable output power cannot be obtained. In the present invention, c(x) exists in common in the reference value and the detection value by multiplying f(x), as the reference value, by a term of c(x) which is associated with the detection value. This enables comparison using the same table. That is, when ΔP=0, the reference value (equal to the true value) can completely coincide with the detection value (equal to the transmission power value), and stable transmission power is obtained.

By setting the data subjected to the process for correcting a loss of the power by the detected capacity (time constant) of the wave detector unit 4 as reference data, automatic gain control can be stably controlled in the case of handling a modulation wave having a marked variation in amplitude, such as CDMA.

Incidentally, the above-described embodiment is preferable in the present invention, however it can also be variously modified and embodied without departing the spirit of the present invention.

As is clearly understood from the aforementioned description, according to the automatic gain control system of the present invention, for the base-band signal obtained by the control unit, deterioration in the wave detector unit is compensated for by multiplying the data which is equivalent to the time constant in the wave detector unit, thereby compensating for the difference caused by the time constant during detection. Accordingly, it is possible to compensate for the deterioration in the detection voltage generated when detecting the modulation wave having a marked variation in amplitude, such as CDMA, and also to obtain stable power outputted by the RF unit.

The detection voltage outputted by the wave detector unit is multiplied by the data equivalent to the time constant of the wave detector unit. Thus, it is possible to compensate for an error caused by deterioration in the detection voltage in the case of detecting a modulation wave having a marked variation in amplitude, such as CDMA. Accordingly, stable automatic gain control can be performed in consideration of the variation in the detection voltage as an output signal which is inputted to the wave detector unit, irrespective of the type of inputted signals.

What is claimed is:

1. An automatic gain control system comprising:
    a transmit-receive control unit for generating a base-band signal serving as reference data of a transmission wave;
    a radio frequency converter unit for converting a frequency of said base-band signal based on a gain variation control signal;
    a coupler unit for splitting said base-band signal of which frequency is converted;
    a wave detector unit for detecting one of the split base-band signal; and
    a gain variation calculation circuit for outputting to said radio frequency converter unit said gain variation control signal which is generated based on a detection result by said wave detector unit and discrete data of said base-band signal outputted by said transmit-receive control unit, and wherein:

said wave detector unit outputs envelope data of the one of split base-band signal and detected capacity information having a time constant of said wave detector unit as said detection result, and said gain variation calculation circuit comprises:
an A/D converter for converting said envelope data into discrete data, and
a comparing calculation circuit for generating said gain variation control signal based on a result of comparing a value obtained by multiplying the discrete data of said base-band signal from said transmit-receive control unit by the time constant, as said detected capacity information, with the discrete data of said envelope data converted by said A/D converter.

2. A system as claimed in claim 1, wherein said transmit-receive control unit comprises:
a serial-to-parallel converter for performing serial-to-parallel conversion of an input signal;
an I/Q encoder for encoding the serial-to-parallel-converted signal by said serial-to-parallel converter to an I-channel signal and a Q-channel signal;
a code for designating code information of said I-channel signal and said Q-channel signal encoded by said I/Q encoder;
a modulator for modulating said I-channel signal and said Q-channel signal encoded by said I/Q encoder on the basis of the code information designated by said code;
a power controller for controlling transmission powers of said I-channel signal and said Q-channel signal which are modulated by said modulator;
at least two multipliers for controlling amplitude values of said I-channel signal and said Q-channel signal on the basis of said control of the transmission power by said power controller;
a multiplexer for multiplexing said I-channel signal and said Q-channel signal from said multiplier;
a filter for limiting bands of said I-channel signal and said Q-channel signal from said multiplexer;
a quadrature modulator for synthesizing and quadrature-modulating said I-channel signal and said Q-channel signal whose bands are limited by said filter;
a frequency converter for converting a frequency of the signal quadrature-modulated by said quadrature modulator into a desired frequency; and
a D/A converter for converting the signal which is converted into the desired frequency by said frequency converter into an analog signal, and
said transmit-receive control unit outputs said signal quadrature-modulated by said quadrature modulator to said comparing calculation circuit as the discrete data of said base-band signal, and further outputs said analog signal converted by said D/A converter to said radio frequency converter unit as said base-band signal.

3. A system as claimed in claim 2, wherein said radio frequency converter unit comprises:
a first mixer for upconverting said base-band signal from said transmit-receive control unit;
a band-pass filter for removing unnecessary waves other than a necessary frequency band from an output from said first mixer;
a first amplifier for amplifying an output from said band-pass filter to a necessary power;
a second mixer for upconverting the output amplified by said first amplifier;
a variable attenuator for varying a gain of an output from said second mixer based on said gain variation control signal; and
a second amplifier for amplifying an output from said variable attenuator to an output having a desired magnitude.

4. A system as claimed in claim 3, wherein:
said coupler unit directly outputs said base-band signal, without changing said signal, whose gain is controlled by said radio frequency converter unit based on said gain variation control signal as a transmission wave, and supplies a signal obtained by splitting 1/N of said gain variation control signal, where N is an integer equal to 1 or more to said wave detector unit.

5. A system as claimed in claim 2, wherein:
said coupler unit directly outputs said base-band signal, without changing said signal, whose gain is controlled by said radio frequency converter unit based on said gain variation control signal as a transmission wave, and supplies a signal obtained splitting 1/N of said gain variation control signal, where N is an integer equal to 1, to said wave detector unit.

6. A system as claimed in claim 1, wherein said radio frequency converter unit comprises:
a first mixer for upconverting said base-band signal from said transmit-receive control unit;
a band-pass filter for removing unnecessary waves other than a necessary frequency band from an output from said first mixer;
a first amplifier for amplifying an output from said band-pass filter to a necessary power;
a second mixer for upconverting the output amplified by said first amplifier;
a variable attenuator for varying a gain of an output from said second mixer based on said gain variation control signal; and
a second amplifier for amplifying an output from said variable attenuator to an output having a desired magnitude.

7. A system as claimed in claim 6, wherein:
said coupler unit directly outputs said base-band signal, without changing said signal, whose gain is controlled by said radio frequency converter unit based on said gain variation control signal as a transmission wave, and supplies a signal obtained by splitting 1/N of said gain variation control signal, where N is an integer equal to 1 or more to said wave detector unit.

8. A system as claimed in claim 1, wherein:
said coupler unit directly outputs said base-band signal, without changing said signal, whose gain is controlled by said radio frequency converter unit based on said gain variation control signal as a transmission wave, and supplies a signal obtained by splitting 1/N of said gain variation control signal, where N is an integer equal to 1 or more, to said wave detector unit.

9. A sysstem as claimed in claims 2 through 4, wherein said comparing calculation circuit comprises:
a time constant table in which said time constant, as said detected capacity information from said wave detector unit, is stored;
a multiplier circuit for multiplying the discrete data of said base-band signal from said transmit-receive control unit by said time constant stored in said time constant table and for outputting the discrete data;

a comparator for comparing the discrete data from said multiplier circuit with the discrete data from said A/D converter; and a variable attenuator control unit for generating said gain variation control signal for controlling conversion by said variable attenuator based on a comparison result by said comparator.

10. A system as claimed in claim 2, wherein said comparing calculation circuit comprises:

a time constant table in which said time constant, as said detected capacity information from said wave detector unit, is stored;

a multiplier circuit for multiplying the discrete data of said base-band signal from said transmit-receive control unit by said time constant stored in said time constant table and for outputting discrete data;

a comparator for comparing the discrete data from said multiplier circuit with the discrete data from said A/D converter; and a variable attenuator control unit for generating said gain variation control signal for controlling conversion by said variable attenuator based on a comparison result by said comparator.

11. A system as claimed in claim 10, wherein said comparator comprises:

a first delay circuit for delaying the discrete data from said multiplier circuit by an arbitrary time;

a second delay circuit for delaying the discrete data from said A/D converter by an arbitrary time;

a first averaging circuit for averaging an output from said first delay circuit over a predetermined time;

a second averaging circuit for averaging an output from said second delay circuit over said predetermined time;

an adder for adding an output from said first averaging circuit and an output from said second averaging circuit and for outputting an average voltage value;

a comparison value conversion table in which a comparison value for said average voltage value outputted from said adder is stored; and a multiplier for multiplying said average voltage value by said comparison value stored in said comparison value conversion table.

12. An automatic gain control system which generates a base-band signal serving as reference data of a transmission wave and splits said base-band signal which has been frequency converted based on a gain variation control signal, said control system comprising:

a wave detector unit which detects one of the split base-band signal and outputs envelope data of the one of the split base-band signal and detected capacity information having a time constant of said wave detector unit as a detection result; and a comparing unit which generates said gain variation control signal based on a result of comparing a value, obtained by multiplying discrete data of said base-band signal by said time constant, with discrete data of said envelope data.

13. An automatic gain control method comprising:

generating a base-band signal as reference data of a transmission wave;

frequency converting said base band signal based on a gain variation control signal;

splitting said base-band signal which has been frequency converted;

detecting one of the split base-band signal;

outputting envelope data of the one of the split base-band signal and detected capacity information having a time constant as a detection result;

comparing a value, obtained by multiplying discrete data of said base-band signal by said time constant, with discrete data of said envelope data; and generating said gain variation control signal based on a result of said comparing.

* * * * *